(12) United States Patent
Maruo et al.

(10) Patent No.: US 8,080,855 B2
(45) Date of Patent: Dec. 20, 2011

(54) SEMICONDUCTOR DEVICE AND METHOD OF MANUFACTURING THE SAME

(75) Inventors: Tetsumasa Maruo, Osaka (JP);
Masanori Minamio, Osaka (JP); Satoru Waga, Niigata (JP); Tetsushi Nishio, Kyoto (JP)

(73) Assignee: Panasonic Corporation, Osaka (JP)

( * ) Notice: Subject to any disclaimer, the term of this patent is extended or adjusted under 35 U.S.C. 154(b) by 173 days.

(21) Appl. No.: 12/407,837

(22) Filed: Mar. 20, 2009

(65) Prior Publication Data

US 2009/0236613 A1    Sep. 24, 2009

(30) Foreign Application Priority Data

Mar. 24, 2008  (JP) ................................ 2008-074783
Jan. 16, 2009  (JP) ................................ 2009-007114

(51) Int. Cl.
*H01L 29/93* (2006.01)
(52) U.S. Cl. ................. 257/432; 257/E33.076; 257/680
(58) Field of Classification Search .......... 257/432–434, 257/E33.076, 432–43, 995, 680, 681
See application file for complete search history.

(56) References Cited

U.S. PATENT DOCUMENTS

| | | | |
|---|---|---|---|
| 5,616,949 A * | 4/1997 | Watanabe | 257/434 |
| 6,599,770 B2 | 7/2003 | Miyamoto | 438/48 |
| 7,001,797 B2 | 2/2006 | Hashimoto | 438/113 |
| 7,271,460 B2 | 9/2007 | Nagasaka et al. | 257/432 |
| 2008/0265350 A1 * | 10/2008 | Wu et al. | 257/432 |

FOREIGN PATENT DOCUMENTS

JP    2005-340752    12/2005

* cited by examiner

*Primary Examiner* — Matthew Reames
(74) *Attorney, Agent, or Firm* — Steptoe & Johnson LLP (57) ABSTRACT

According to the present invention, a protective seal S1 for protecting a transparent member 11 is composed of an organic base 16, adhesive layers 17, and a second adhesive layer 18 having low adhesion. The adhesive layers 17 are provided only on edges corresponding, on the organic base 16, to sides 11*b* of the transparent member and the second adhesive layer 18 is provided on a portion corresponding, on the organic base 16, to a surface 11*a* of the transparent member. The organic base 16 is fixed to the sides 11*b* and the surface 11*a* of the transparent member 11 with the adhesive layers 17 and 18.

19 Claims, 5 Drawing Sheets

SEMICONDUCTOR DEVICE AND METHOD OF MANUFACTURING THE SAME

FIELD OF THE INVENTION

The present invention relates to a semiconductor device such as a semiconductor imaging device including, for example, a light receiving element as an optical element, and a method of manufacturing the same.

BACKGROUND OF THE INVENTION

In the prior art, in semiconductor devices composing semiconductor imaging devices and the like, each optical element having an element region including at least one of a light receiving region and a light emitting region is, for example, a CCD acting as a light receiving element having a light receiving region or an image sensor having a CMOS configuration. For such semiconductor devices, the following configuration has been proposed: a semiconductor element which includes an imaging region having an image sensor formed therein as a light receiving element and includes a plurality of bonding pads is mounted in a recessed cavity formed in a package body, a transparent member is mounted over the cavity, and the transparent member and the package body are secured with a resin adhesive.

In the proposed configuration of the semiconductor device, the semiconductor element is die bonded to a die attachment surface in the cavity of the package body made of ceramic, with a resin such as epoxy resin or a resin sheet. Further, the connecting terminals of the package body and the Al electrodes (bonding pads) of the semiconductor element are electrically connected to each other by wire bonding, and then the cavity is covered with the transparent member. Moreover, the transparent member is fixed on the package body by bonding with a resin adhesive. After that, a protective seal is bonded over the transparent member in order to protect the transparent member during transportation or protect a surface of the transparent member during mounting.

On a surface of the semiconductor element mounted in the semiconductor device configured thus, a plurality of microlenses are formed. Microlenses are called on-chip lenses and are made of acrylic resin which increases a light condensing rate. Such lenses have disadvantages in terms of heat resistance. To be specific, microlenses are softened and deformed by heat applied for a long time. Further, the resin adhesive used for fixing the transparent member to the package body does not have heat resistance.

However, in recent years, there is a growing need for semiconductor devices used with CCDs and image sensors having CMOS configurations under high temperature and humidity conditions. In response to this need, on-chip lens materials and resin adhesives have been improved, so that heat resistance and humidity resistance under high temperature and humidity conditions have been increased for the semiconductor devices and resin adhesives used for the semiconductor devices. Thus the semiconductor devices can be used in such an environment.

Further, the semiconductor device configured thus is mounted on a mounting substrate under high temperature conditions and thus materials resistant to the high temperature conditions during mounting have been demanded. Moreover, when the semiconductor device is mounted on the substrate, a protective seal is necessary for protecting the transparent member from scratches and dust. The protective seal also has to be resistant to heat under the high temperature conditions when the semiconductor device is mounted. Further, it is important to prevent the adhesive of the protective seal from being left on the surface of the transparent member when the protective seal is peeled after passing under the high temperature conditions during mounting.

As a method for preventing the adhesive of a protective seal from being left, for example, Japanese Patent Laid-Open No. 2005-340752 discloses a technique in which a protective seal has a base made of polyethylene naphthalate and is formed by bonding adhesive tapes, each having an adhesive layer at least on one surface. In this technique, it is preferable that the adhesive layer is not provided on a part extended over a light receiving region on a glass surface composing a surface of a video sensor.

In this case, the adhesive layer of the protective seal is not left in the light receiving region on the glass surface but is left in the other regions on the glass surface, so that it is necessary to wipe the glass surface.

However, in the semiconductor device of the prior art, the protective seal is composed of the base made of an organic material and the adhesive layer, and thus when the protective seal is peeled, the outside shape of the protective seal and the adhesive may be left on the surface of the transparent member, that is, on an imaging surface. When the adhesive is left on the imaging surface, the adhesive on the imaging surface may be reflected in an image.

Comparing a heated protective seal and an unheated protective seal, it is found that adhesive is more likely to be left when the protective seal is heated by thermally decomposing the adhesive and the adhesive is more likely to be left when the protective seal is processed under high moisture conditions as compared with the adhesive of the protective seal not processed under high moisture conditions.

Moreover, when the protective seal is bonded to the transparent member, bubbles (voids) may be trapped. In this case, the adhesive is likely to be left around the bubbles.

As a solution to the left adhesive, the surface of the transparent member may be wiped after the protective seal of tape is peeled. In this method, the left adhesive may be spread over the surface of the transparent member during wiping, so that special chemicals have to be used.

Further, when the surface of the transparent member is wiped, dirt or dust left on the transparent member may cause quality defect. Thus wiping has to be carefully performed, which leads to a distinct disadvantage in terms of cost.

DISCLOSURE OF THE INVENTION

The present invention has been devised to solve the problems of the prior art. An object of the present invention is to provide a semiconductor device and a method of manufacturing the same which can prevent a protective seal from leaving adhesive on a surface of a transparent member even under high temperature conditions when the semiconductor device is mounted, while sufficiently protecting the transparent member from scratches and dust with the protective seal during mounting.

In order to solve the problems, a semiconductor device of the present invention includes: a semiconductor element having an element region including at least one of a light receiving region and a light emitting region; a transparent member; and a protective seal for covering the surface of the transparent member, wherein the transparent member is disposed on the semiconductor element and the protective seal is bonded only to the sides of the transparent member.

Further, a semiconductor device of the present invention includes: a semiconductor element which has an element region including at least one of a light receiving region and a light emitting region and has a plurality of bonding pads; a substrate having a plurality of connecting terminals in a cavity for storing the semiconductor element; wires for connecting the bonding pads and the connecting terminals; a transparent member bonded to the substrate; and a protective seal for covering the surface of the transparent member, wherein the protective seal is bonded only to the sides of the transparent member.

Moreover, a semiconductor device of the present invention includes: a semiconductor element which has an element region including at least one of a light receiving region and a light emitting region and has a plurality of bonding pads; a transparent member attached to the top surface of the semiconductor element so as to cover the element region; a substrate which includes a plurality of connecting terminals and has the semiconductor element die bonded thereon; wires for connecting the bonding pads and the connecting terminals; a mold resin for sealing the semiconductor element, the sides of the transparent member, and the wires on the substrate; and a protective seal for covering the surface of the transparent member and the top surface of the mold resin, wherein the protective seal is bonded only to the top surface of the mold resin.

Further, the protective seal includes at least one crease formed in parallel with one side of the transparent member.

A method of manufacturing a semiconductor device of the present invention includes the steps of: preparing a semiconductor element beforehand which has an element region including at least one of a light receiving region and a light emitting region and has a plurality of bonding pads; preparing a substrate which has a plurality of connecting terminals in a cavity for storing the semiconductor element; storing the semiconductor element in the cavity; connecting the bonding pads and the connecting terminals via wires; bonding a transparent member to the substrate; and covering the surface of the transparent member with a protective seal for protecting the surface of the transparent member, in a state in which the protective seal is bonded only to the sides of the transparent member.

Moreover, the protective seal includes at least one crease formed in parallel with one side of the transparent member.

As described above, according to the present invention, it is possible to prevent the adhesive layer from leaving adhesive on the surface of the transparent member when the protective seal attached to the transparent member is peeled, even in the event of a thermal stress under high temperature conditions during mounting, while sufficiently protecting the transparent member from scratches and dust with the protective seal when the semiconductor device is mounted.

Thus the semiconductor device can obtain sufficient heat resistance and moisture resistance, so that a semiconductor device such as a semiconductor imaging device can be easily achieved with high reliability.

DESCRIPTION OF THE EMBODIMENTS

A semiconductor device and a method of manufacturing the same according to embodiments of the present invention will be specifically described below with reference to the accompanying drawings. In these drawings, the thicknesses, lengths, and so on of components are made different from the actual shapes in the preparation of the drawings. Further, the electrodes and terminals of the components are made different in number from actual components to simplify the illustration. Moreover, the materials of the components are not limited to materials described in the following explanation.

First Embodiment

The following will describe a semiconductor device according to a first embodiment of the present invention.

Figure 1:
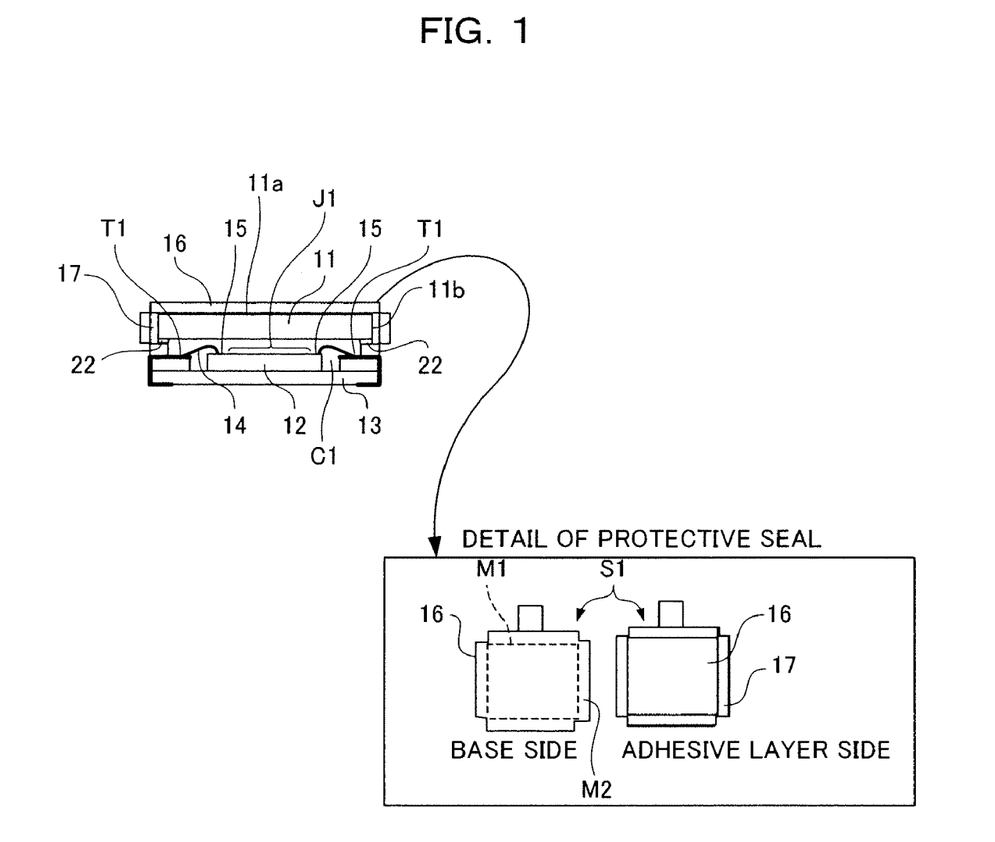
FIG. 1 is a sectional view showing the configuration of a semiconductor device according to a first embodiment of the present invention.

FIG. 1 is a sectional view showing the configuration of the semiconductor device according to the first embodiment. As shown in FIG. 1, the semiconductor device of the first embodiment includes a semiconductor element 12 which has an element region J1 including at least one of a light receiving region and a light emitting region and has a plurality of bonding pads 15, a substrate 13 which includes a recessed cavity C1 for storing the semiconductor element 12 and has a plurality of connecting terminals T1 in the cavity C1, wires 14 for electrically connecting the bonding pads 15 and the connecting terminals T1, a transparent member 11 bonded to the substrate 13 with a resin adhesive 22 on positions outside the semiconductor element 12 disposed on the substrate 13, and a protective seal S1 for covering a surface 11a and sides 11b of the transparent member 11. The protective seal S1 is composed of an organic base 16 so large as to cover the surface 11a and the sides 11b of the transparent member 11 and adhesive layers 17 provided only on portions covering, on the organic base 16, the sides 11b of the transparent member 11. The shape of the organic base 16 has a first plane M1 larger than the surface 11a of the transparent member 11 and second planes M2 extending from sides around the first plane M1 over the sides 11b of the transparent member 11 and the top surface of the cavity C1.

The organic base 16 of the protective seal S1 has portions covering the sides 11b of the transparent member 11 and only the portions are bonded to the transparent member 11 with the adhesive layers 17.

Generally, the wires 14 are Au wires.

In the protective seal S1, the organic base 16 has a region covering the surface 11a of the transparent member 11 and the region is generally colorless and transparent or is transparently colored.

The organic base 16 of the protective seal S1 is mainly made of a material such as polyimide and polyethylene terephthalate. The adhesive layers 17 are mainly made of acrylic and silicone materials.

With this configuration, the adhesive layers 17 of the protective seal S1 are not provided on a portion covering the surface 11a of the transparent member 11 of the semiconductor device. Thus it is possible to achieve a semiconductor device in which adhesive is not left on the surface 11a of the transparent member 11 after the protective seal S1 is peeled, even when heat is applied to mount the semiconductor device on a mounting substrate.

Further, even when the semiconductor device is mounted on the mounting substrate under high temperature conditions, the adhesive layers 17 of the protective seal S1 bonded to the transparent member 11 are not left on the surface 11a of the transparent member 11. Thus it is possible to achieve a reliable semiconductor device which does not allow left adhesive to be reflected in an image.

Second Embodiment

The following will describe a semiconductor device according to a second embodiment of the present invention.

Figure 2:
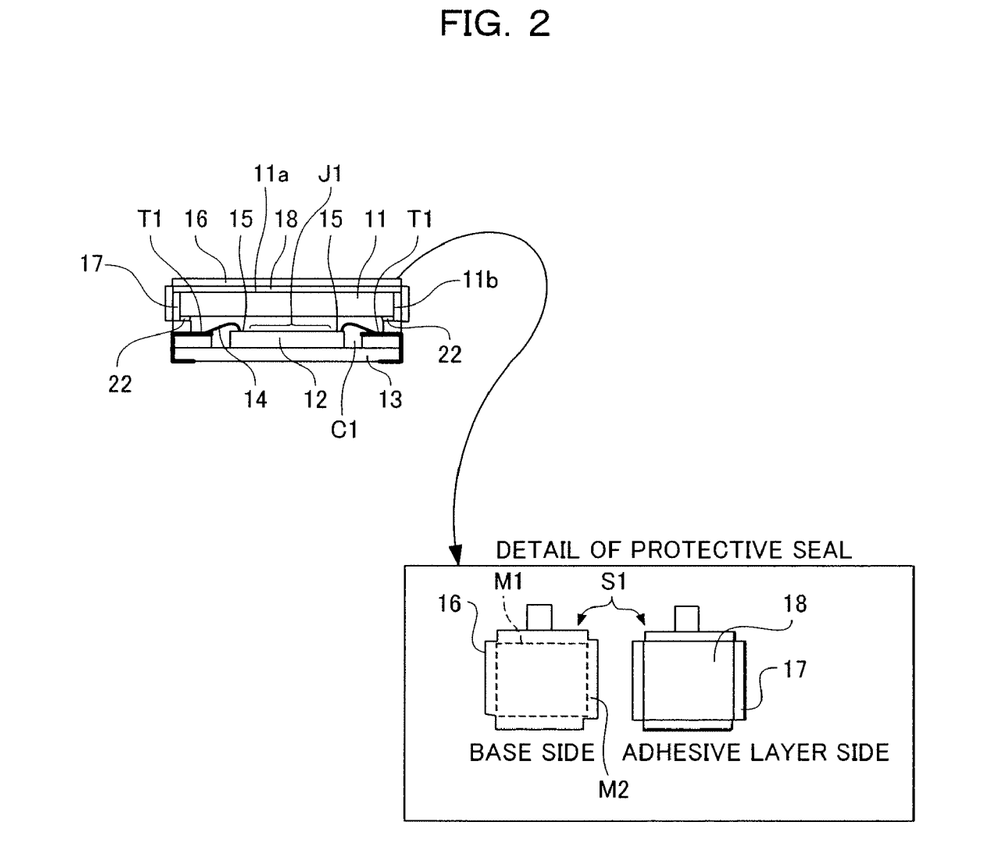
FIG. 2 is a sectional view showing the configuration of a semiconductor device according to a second embodiment of the present invention.

FIG. 2 is a sectional view showing the configuration of the semiconductor device according to the second embodiment. As shown in FIG. 2, the semiconductor device of the present embodiment includes a semiconductor element 12 which has an element region J1 including at least one of a light receiving region and a light emitting region and has a plurality of bonding pads 15, a substrate 13 which includes a recessed cavity C1 for storing the semiconductor element 12 and has a plurality of connecting terminals T1 in the cavity C1, wires 14 for electrically connecting the bonding pads 15 and the connecting terminals T1, a transparent member 11 bonded to the substrate 13 with a resin adhesive 22 on positions outside the semiconductor element 12 disposed on the substrate 13, and a protective seal S1 for covering a surface 11a and sides 11b of the transparent member 11. The protective seal S1 is composed of an organic base 16 so large as to cover the surface 11a and the sides 11b of the transparent member 11, adhesive layers 17 provided on portions covering, on the organic base 16, the sides 11b of the transparent member 11, and a second adhesive layer 18 which is provided on a portion covering, on the organic base 16, the surface 11a of the transparent member 11 and has lower adhesion than the adhesive layers 17, so that the adhesion of the second adhesive layer 18 is lower than in other regions. The shape of the organic base 16 has a first plane M1 larger than the surface 11a of the transparent member 11 and second planes M2 extending from sides around the first plane M1 over the sides 11b of the transparent member 11 and the top surface of the cavity C1.

The organic base 16 of the protective seal S1 has portions covering the sides 11b of the transparent member 11 and the portions are bonded to the transparent member 11 with the adhesive layers 17. Further, the organic base 16 has a portion covering the surface 11a of the transparent member 11 and the portion is bonded to the transparent member 11 with the second adhesive layer 18.

Generally, the wires 14 are Au wires.

In the protective seal S1, the organic base 16 has a region covering the surface 11a of the transparent member 11 and the region is generally colorless and transparent or is transparently colored.

The organic base 16 of the protective seal S1 is mainly made of a material such as polyimide and polyethylene terephthalate. The adhesive layers 17 are mainly made of acrylic and silicone materials.

With this configuration, it is possible to more reliably protect the surface 11a of the transparent member 11 from external contamination during mounting and so on.

Third Embodiment

The following will describe a semiconductor device according to a third embodiment of the present invention.

Figure 3:
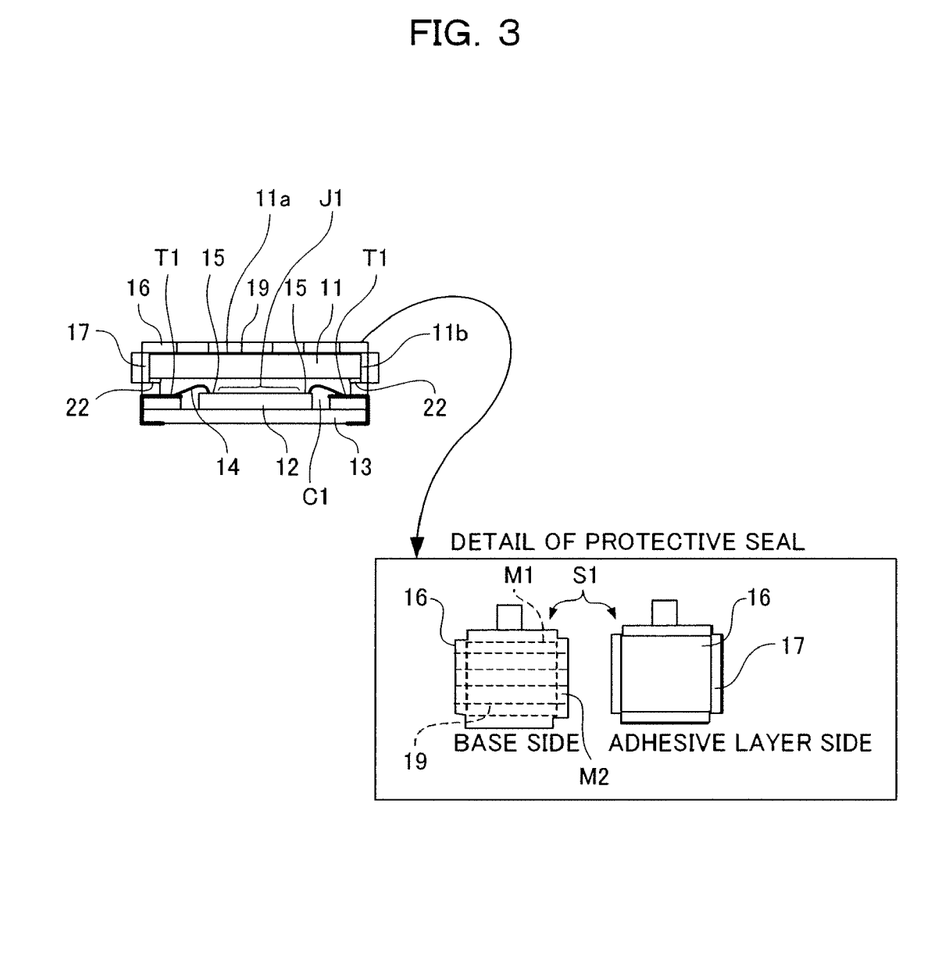
FIG. 3 is a sectional view showing the configuration of a semiconductor device according to a third embodiment of the present invention.

FIG. 3 is a sectional view showing the configuration of the semiconductor device according to the third embodiment. As shown in FIG. 3, the semiconductor device of the third embodiment includes a semiconductor element 12 which has an element region J1 including at least one of a light receiving region and a light emitting region and has a plurality of bonding pads 15, a substrate 13 which includes a recessed cavity C1 for storing the semiconductor element 12 and has a plurality of connecting terminals T1 in the cavity C1, wires 14 for electrically connecting the bonding pads 15 and the connecting terminals T1, a transparent member 11 bonded to the substrate 13 with a resin adhesive 22 on positions outside the semiconductor element 12 disposed on the substrate 13, and a protective seal S1 for covering a surface 11a and sides 11b of the transparent member 11. The protective seal S1 is composed of an organic base 16 so large as to cover the surface 11a and the sides 11b of the transparent member 11 and adhesive layers 17 provided only on portions covering, on the organic base 16, the sides 11b of the transparent member 11. The shape of the organic base 16 has a first plane M1 larger than the surface 11a of the transparent member 11 and second planes M2 extending from sides around the first plane M1 over the sides 11b of the transparent member 11 and the top surface of the cavity C1. The organic base 16 further includes at least one crease 19 formed in parallel with one side of the transparent member 11.

The organic base 16 of the protective seal S1 has portions covering the sides 11b of the transparent member 11 and only the portions are bonded to the transparent member 11 with the adhesive layers 17.

Generally, the wires 14 are Au wires.

In the protective seal S1, the organic base 16 has a region covering the surface 11a of the transparent member 11 and the region is generally colorless and transparent or is transparently colored.

The organic base 16 of the protective seal S1 is mainly made of a material such as polyimide and polyethylene terephthalate. The adhesive layers 17 are mainly made of acrylic and silicone materials.

As in the second embodiment, in the semiconductor device of the third embodiment, the organic base 16 of the protective seal S1 may further include a second adhesive layer 18 which is provided on a portion covering the surface 11a of the transparent member 11 and has lower adhesion than the adhesive layers 17, so that the adhesion of the second adhesive layer 18 is lower than in other regions.

With this configuration, it is possible to peel the protective seal S1 from the transparent member 11 without applying a stress to the adhesive layers 17.

(Method of Manufacturing the Semiconductor Device)

The following will describe a method of manufacturing the semiconductor device according to the embodiments of the present invention. The semiconductor device of the first embodiment will be illustrated as an example of the manufacturing method.

Figure 4:
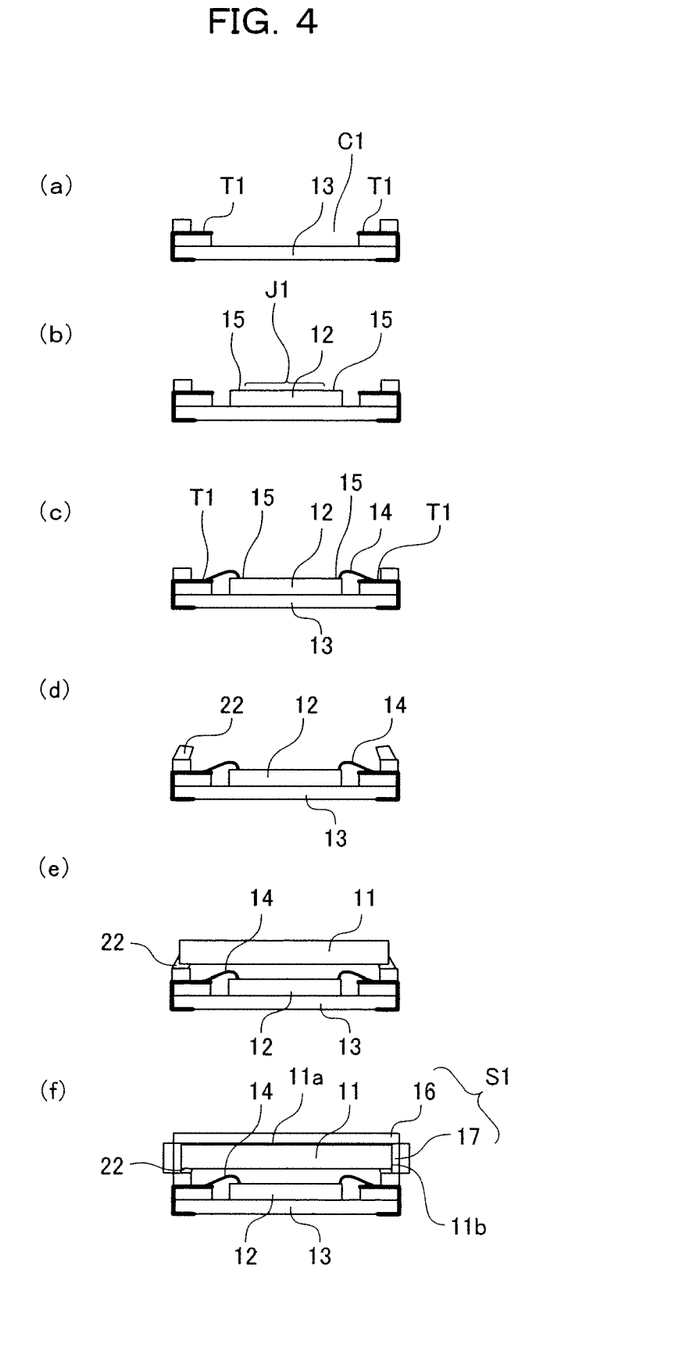
FIG. 4 is a sectional view showing a method of manufacturing the semiconductor device according to the first embodiment of the present invention.

FIG. 4 is a sectional view showing the method of manufacturing the semiconductor device according to the first embodiment. The process of the method of manufacturing the semiconductor device is dividedly illustrated in FIGS. 4(A) to 4(F).

The semiconductor element 12 is prepared beforehand which has the element region J1 including at least one of the light receiving region and the light emitting region and has the plurality of bonding pads 15. Further, the substrate 13 is prepared which includes the recessed cavity C1 for storing the semiconductor element 12 and has the plurality of connecting terminals T1 in the cavity T1 (step (a)).

Next, the semiconductor element 12 is stored in the cavity C1 of the substrate 13 by die bonding with a die bonding material (step (b)). After that, the plurality of bonding pads 15 of the semiconductor element 12 and the plurality of connecting terminals T1 in the substrate 13 are electrically connected to each other via the Au wires 14 (step (c)). Next, the resin adhesive 22 for bonding the transparent member 11 is applied on the substrate 13 (step (d)).

After that, the transparent member 11 is placed on the resin adhesive 22 and is positioned at proper positions outside the semiconductor element 12 on the substrate 13, and then the resin adhesive 22 is cured with ultraviolet radiation or heat, so that the transparent member 11 is bonded to the substrate 13 (step (e)). Next, the protective seal S1 made up of the organic base 16 and the adhesive layers 17 is bonded to the sides 11b of the transparent member 11 with the adhesive layers 17 to protect the surface 11a of the transparent member 11, so that the surface 11a and the sides 11b of the transparent member 11 are covered with the protective seal S1 (step (f)).

The semiconductor device is manufactured by the foregoing steps.

The semiconductor devices of the second and third embodiments can be similarly manufactured by the steps of the manufacturing method.

Another Embodiment

The following will describe a structural example of a semiconductor device according to another embodiment of the present invention.

Figure 5:
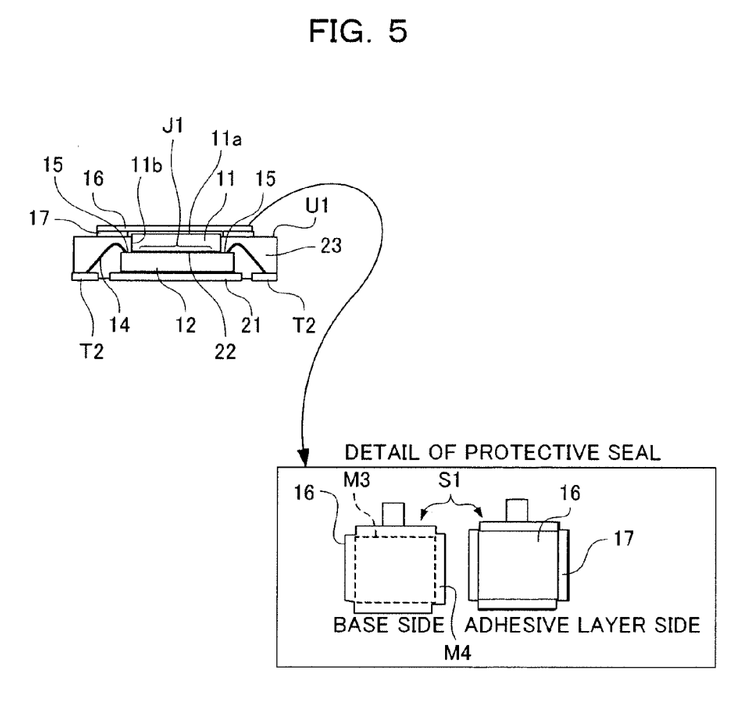
FIG. 5 is a sectional view showing the configuration of a semiconductor device according to another embodiment of the present invention.

FIG. 5 is a sectional view showing another structural example of the semiconductor device according to the present embodiment. As shown in FIG. 5, the semiconductor device of the present embodiment includes a semiconductor element 12 which has an element region J1 including at least one of a light receiving region and a light emitting region and has a plurality of bonding pads 15, a transparent member 11 bonded to the top surface of the semiconductor element 12 with a resin adhesive 22 so as to cover the element region J1, a substrate 21 which includes a plurality of connecting terminals T2 and has the semiconductor element 12 die bonded thereon, wires 14 for electrically connecting the bonding pads 15 and the connecting terminals T2, a mold resin 23 for sealing the semiconductor element 12, sides 11b of the transparent member 11, and the wires on the substrate 21, and a protective seal S1 for covering a surface 11a of the transparent member 11 and a surface (will be referred to as a top surface U1) of the mold resin 23 on the side where the surface 11a of the transparent member 11 is exposed. The protective seal S1 is composed of an organic base 16 so large as to cover the surface 11a of the transparent member 11 and the top surface U1 of the mold resin 23, and adhesive layers 17 provided only on portions covering, on the organic base 16, the top surface U1 of the mold resin 23. The shape of the organic base 16 has a third plane M3 larger than the surface 11a of the transparent member 11 and fourth planes M4 extending from sides around the third plane M3 over the top surface U1 of the mold resin 23.

The organic base 16 of the protective seal S1 has portions covering the top surface U1 of the mold resin 23 and only the portions are bonded to the mold resin 23 with the adhesive layers 17.

When the top surface U1 of the mold resin 23 is flush with the surface 11a of the transparent member 11, the adhesive layers 17 of the protective seal S1 may be provided at points other than the transparent member 11.

In the protective seal S1, the organic base 16 has a region covering the surface 11a of the transparent member 11 and the region is generally colorless and transparent or is transparently colored.

Further, in the protective seal S1, the organic base 16 preferably includes at least one crease 19 formed in parallel with one side of the transparent member 11.

With this configuration, it is possible to peel the protective seal S1 from the transparent member 11 without applying a stress to the adhesive layers 17.

Generally, the wires 14 are Au wires.

The organic base 16 of the protective seal S1 is mainly made of a material such as polyimide and polyethylene terephthalate. The adhesive layers 17 are mainly made of acrylic and silicone materials.

The substrate 21 may be one of an organic substrate and a lead frame.

As in the second embodiment, in the semiconductor device of the present embodiment, the organic base 16 of the protective seal S1 may further include a second adhesive layer 18 which is provided on a portion covering the surface 11a of the transparent member 11 and has lower adhesion than the adhesive layers 17, so that the adhesion of the second adhesive layer 18 is lower than in other regions.

With this configuration, the same effect can be obtained as in the foregoing embodiments.

In the foregoing embodiments, the organic base 16 of the protective seal S1 may be mainly made of materials such as polyethylene terephthalate, polyphenylene sulfide, polyallylate, polysulfone, polyethersulfone, polyether ether ketone, polyether-imide, polyamide-imide, liquid crystal polymer, polyimide, polyphthalamide, polyethylene naphthalate, and fluororesin. In view of heat resistance and a rate of shrinkage, it is particularly preferable that the organic base 16 is mainly made of polyimide.

Further, in the protective seal S1, it is desirable that the adhesive layers 17 are 10 µm in thickness and the organic base 16 is 50 µm in thickness.

Figure 6:
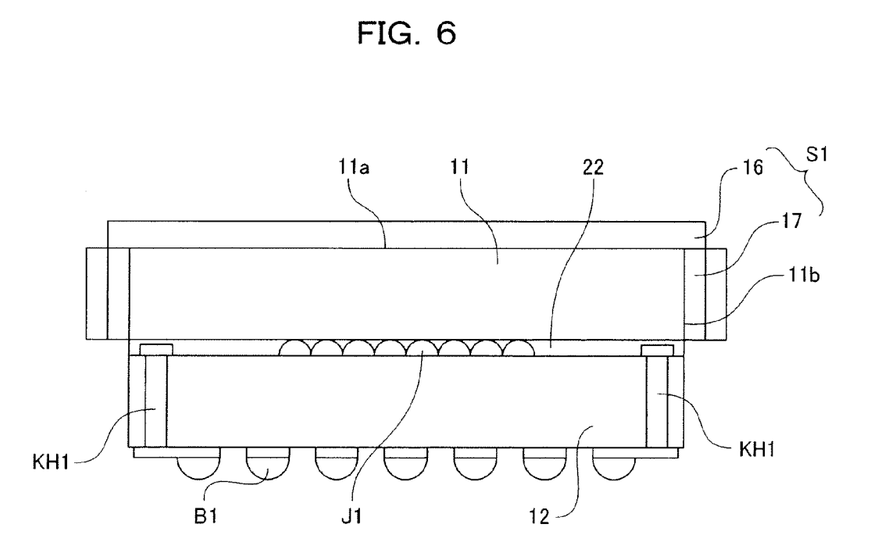
FIG. 6 is a sectional view showing the configuration of a semiconductor device according to still another embodiment of the present invention.

As shown in FIG. 6, the present invention is also applicable to a Si-penetrating (bonded piece by piece) semiconductor device (package) in which through wiring KH1 and balls B1 are provided on a semiconductor element 12.

In this package, the chip-sized semiconductor device has an element region J1 including at least one of a light receiving region and a light emitting region. The protective seal S1 has portions covering sides 11b of a transparent member 11 and only the portions are bonded with adhesive layers 17.

In such a chip-sized semiconductor device, the characteristics are quite seriously affected by contamination on a glass surface. However, the present embodiment can prevent the protective seal from leaving adhesive in the chip-sized semiconductor device.

FIG. 1
1 DETAIL OF PROTECTIVE SEAL
2 BASE SIDE
3 ADHESIVE LAYER SIDE
FIG. 2
1 DETAIL OF PROTECTIVE SEAL
2 BASE SIDE
3 ADHESIVE LAYER SIDE
FIG. 3
1 DETAIL OF PROTECTIVE SEAL
2 BASE SIDE
3 ADHESIVE LAYER SIDE
FIG. 5
1 DETAIL OF PROTECTIVE SEAL
2 BASE SIDE
3 ADHESIVE LAYER SIDE

What is claimed is:

1. A semiconductor device, comprising:
a semiconductor element having an optical element region;
a transparent member having an upper surface, a lower surface and a side surface; and
a protective seal adjacent to the upper surface and the side surface of the transparent member,
wherein the transparent member is on the semiconductor element,
a region of the protective seal directly above the semiconductor element is directly connected to the upper surface of the transparent member, and
the protective seal is connected to the side surface of the transparent member via a first adhesive.

2. The semiconductor device according to claim 1,
wherein a hollow is between the semiconductor element and the transparent member.

3. A semiconductor device, comprising:
a semiconductor element having an optical element region;
a substrate having a cavity, the cavity storing the semiconductor element;
a transparent member having an upper surface, a lower surface and a side surface, the lower surface of the transparent member bonded to the substrate; and
a protective seal adjacent to the upper surface and the side surface of the transparent member,
wherein a region of the protective seal directly above the semiconductor element is directly connected to the upper surface of the transparent member, and
the protective seal is connected to the side surface of the transparent member via a first adhesive.

4. The semiconductor device according to claim 3,
wherein the protective seal comprises a base.

5. A semiconductor device, comprising:
a semiconductor element having an optical element region;
a transparent member having an upper surface, a lower surface and a side surface, the lower surface of the transparent member connected to an upper surface of the semiconductor element to cover the optical element region;
a substrate on which the semiconductor element is mounted;
a mold resin connected to a side surface of the semiconductor element; and
a protective seal adjacent to the upper surface of the transparent member and an upper surface of the mold resin,
wherein a region of the protective seal directly above the semiconductor element is directly connected to the upper surface of the transparent member, and
the protective seal is connected to the upper surface of the mold resin via a first adhesive.

6. The semiconductor device according to claim 5,
wherein the protective seal comprises a base.

7. The semiconductor device according to claim 3,
wherein in the protective seal, a region covering the upper surface of the transparent member is transparent.

8. The semiconductor device according to claim 4,
wherein in the protective seal, a region covering the upper surface of the transparent member is transparent.

9. The semiconductor device according to claim 5,
wherein in the protective seal, a region covering the upper surface of the transparent member is transparent.

10. The semiconductor device according to claim 6,
wherein in the protective seal, a region covering the upper surface of the transparent member transparent.

11. The semiconductor device according to claim 1,
wherein the protective seal is connected to the upper surface of the transparent member via a second adhesive which has lower adhesion than the first adhesive.

12. The semiconductor device according to claim 3,
wherein the protective seal is connected to the upper surface of the transparent member via a second adhesive, and
an adhesion of the second adhesive is lower than an adhesion of the first adhesive.

13. The semiconductor device according to claim 5,
wherein the protective seal is connected to the upper surface of the transparent member via a second adhesive, and
an adhesion of the second adhesive is lower than an adhesion of the first adhesive.

14. The semiconductor device according to claim 1,
wherein the optical element region includes at least one of a light receiving region and a light transmitting region.

15. The semiconductor device according to claim 3,
wherein the optical element region includes at least one of a light receiving region and a light transmitting region.

16. The semiconductor device according to claim 5,
wherein the optical element region includes at least one of a light receiving region and a light transmitting region.

17. The semiconductor device according to claim 1,
wherein the protective seal is connected to the entire upper surface of the transparent member.

18. The semiconductor device according to claim 3,
wherein the protective seal is connected to the entire upper surface of the transparent member.

19. The semiconductor device according to claim 5,
wherein the protective seal is connected to the entire upper surface of the transparent member.

* * * * *